United States Patent
Haukka et al.

(10) Patent No.: US 7,563,715 B2
(45) Date of Patent: Jul. 21, 2009

(54) METHOD OF PRODUCING THIN FILMS

(75) Inventors: Suvi Haukka, Helsinki (FI); Hannu Huotari, Espoo (FI)

(73) Assignee: ASM International N.V., Almere (NL)

( * ) Notice: Subject to any disclaimer, the term of this patent is extended or adjusted under 35 U.S.C. 154(b) by 32 days.

(21) Appl. No.: 11/294,843

(22) Filed: Dec. 5, 2005

(65) Prior Publication Data

US 2007/0128858 A1   Jun. 7, 2007

(51) Int. Cl.
*H01L 21/44* (2006.01)
(52) U.S. Cl. ............... 438/680; 438/685; 257/E21.462
(58) Field of Classification Search ............ 438/685; 257/E21.463, E21.462
See application file for complete search history.

(56) References Cited

U.S. PATENT DOCUMENTS

| | | | |
|---|---|---|---|
| 3,405,801 A | 10/1968 | Zwiacher et al. |
| 4,058,430 A | 11/1977 | Suntola et al. |
| 4,477,296 A | 10/1984 | Nair |
| 4,486,487 A | 12/1984 | Skarp |
| 4,747,367 A | 5/1988 | Posa |
| 4,761,269 A | 8/1988 | Conger et al. |
| 5,071,670 A | 12/1991 | Kelly |
| 5,294,286 A | 3/1994 | Nishizawa et al. |
| 5,306,666 A | 4/1994 | Izumi |
| 5,320,719 A | 6/1994 | Lasbmore et al. |
| 5,372,962 A | 12/1994 | Hirota et al. |
| 5,382,333 A | 1/1995 | Ando et al. |
| 5,449,314 A | 9/1995 | Meikle et al. |
| 5,453,494 A | 9/1995 | Kirlin et al. |
| 5,610,106 A | 3/1997 | Foster et al. |
| 5,625,217 A | 4/1997 | Chau et al. |
| 5,711,811 A | 1/1998 | Suntola et al. |
| 5,731,634 A | 3/1998 | Matsuo et al. |
| 5,769,950 A | 6/1998 | Takasu et al. |
| 5,783,478 A | 7/1998 | Chau et al. |
| 5,795,495 A | 8/1998 | Meikle |
| 5,865,365 A | 2/1999 | Nishikawa et al. |
| 5,916,365 A | 6/1999 | Sherman |
| 5,939,334 A | 8/1999 | Nguyen et al. |
| 6,006,763 A | 12/1999 | Mori et al. |
| 6,033,584 A | 3/2000 | Ngo et al. |
| 6,066,533 A | 5/2000 | Yu |

(Continued)

FOREIGN PATENT DOCUMENTS

DE          41 08 73          8/1923

(Continued)

OTHER PUBLICATIONS

Petra Alen, "Atomic Layer Deposition of TaN, NbN, and MoN Films for Cu Metallizations", Academic Dissertation, Jun. 22, 2005, Helsinki, Finland.

(Continued)

*Primary Examiner*—Lex Malsawma
(74) *Attorney, Agent, or Firm*—Knobbe Martens Olson & Bear LLP (57) ABSTRACT

A process for producing metal nitride thin films comprising doping the metal nitride thin films by atomic layer deposition (ALD) with silicon or boron or a combination thereof. The work function of metal nitride thin films, which are used in metal electrode applications, can efficiently be tuned.

20 Claims, 5 Drawing Sheets

U.S. PATENT DOCUMENTS

| | | | |
|---|---|---|---|
| 6,066,892 A | 5/2000 | Ding et al. | |
| 6,090,666 A | 7/2000 | Ueda et al. | |
| 6,124,189 A | 9/2000 | Watanabe et al. | |
| 6,130,123 A | 10/2000 | Liang et al. | |
| 6,153,935 A | 11/2000 | Edelstein et al. | |
| 6,166,417 A | 12/2000 | Bai et al. | |
| 6,174,799 B1 | 1/2001 | Lopatin et al. | |
| 6,174,809 B1 | 1/2001 | Kang et al. | |
| 6,200,893 B1 | 3/2001 | Sneh | |
| 6,225,168 B1 | 5/2001 | Gardner et al. | |
| 6,265,258 B1 | 7/2001 | Liang et al. | |
| 6,291,282 B1 | 9/2001 | Wilk et al. | |
| 6,294,836 B1 | 9/2001 | Paranjpe et al. | |
| 6,303,500 B1 | 10/2001 | Jiang et al. | |
| 6,323,131 B1 | 11/2001 | Obeng et al. | |
| 6,329,704 B1 | 12/2001 | Akatsu et al. | |
| 6,342,277 B1 | 1/2002 | Sherman | |
| 6,346,151 B1 | 2/2002 | Jiang et al. | |
| 6,362,526 B1 | 3/2002 | Pramanick et al. | |
| 6,365,502 B1 | 4/2002 | Paranjpe et al. | |
| 6,368,954 B1 | 4/2002 | Lopatin et al. | |
| 6,368,961 B1 | 4/2002 | Lopatin et al. | |
| 6,373,111 B1 * | 4/2002 | Zheng et al. | 257/407 |
| 6,383,879 B1 | 5/2002 | Kizilyalli et al. | |
| 6,399,522 B1 | 6/2002 | Tsan et al. | |
| 6,407,435 B1 | 6/2002 | Ma et al. | |
| 6,433,432 B2 | 8/2002 | Shimizu | |
| 6,444,868 B1 | 9/2002 | Vaughn et al. | |
| 6,458,695 B1 * | 10/2002 | Lin et al. | 438/659 |
| 6,482,262 B1 | 11/2002 | Elers et al. | |
| 6,482,740 B2 | 11/2002 | Soininen et al. | |
| 6,506,676 B2 * | 1/2003 | Park et al. | 438/683 |
| 6,511,876 B2 | 1/2003 | Buchanan et al. | |
| 6,518,106 B2 * | 2/2003 | Ngai et al. | 438/157 |
| 6,534,395 B2 | 3/2003 | Werkhoven et al. | |
| 6,537,901 B2 | 3/2003 | Cha et al. | |
| 6,548,886 B1 | 4/2003 | Ikari et al. | |
| 6,551,893 B1 * | 4/2003 | Zheng et al. | 438/387 |
| 6,579,767 B2 | 6/2003 | Park et al. | |
| 6,596,576 B2 | 7/2003 | Fu et al. | |
| 6,613,695 B2 | 9/2003 | Pomarede et al. | |
| 6,627,503 B2 | 9/2003 | Ma et al. | |
| 6,686,271 B2 | 2/2004 | Raaijmakers et al. | |
| 6,696,332 B2 | 2/2004 | Visokay et al. | |
| 6,700,771 B2 | 3/2004 | Bhattacharyya | |
| 6,703,708 B2 | 3/2004 | Werkhoven et al. | |
| 6,709,989 B2 | 3/2004 | Ramdani et al. | |
| 6,713,846 B1 | 3/2004 | Senzaki | |
| 6,714,435 B1 | 3/2004 | Dimmler et al. | |
| 6,717,226 B2 | 4/2004 | Hegde et al. | |
| 6,723,581 B1 | 4/2004 | Chabal et al. | |
| 6,730,163 B2 | 5/2004 | Vaarstra | |
| 6,730,588 B1 | 5/2004 | Schinella | |
| 6,780,704 B1 | 8/2004 | Raaijmakers et al. | |
| 6,800,552 B2 | 10/2004 | Elers et al. | |
| 6,815,354 B2 | 11/2004 | Uzoh et al. | |
| 6,824,816 B2 | 11/2004 | Aaltonen | |
| 6,852,635 B2 | 2/2005 | Satta et al. | |
| 6,858,524 B2 | 2/2005 | Haukka et al. | |
| 6,921,712 B2 | 7/2005 | Soininen et al. | |
| 6,933,225 B2 | 8/2005 | Werkhoven et al. | |
| 6,955,986 B2 | 10/2005 | Li | |
| 6,986,914 B2 | 1/2006 | Elers | |
| 7,045,406 B2 | 5/2006 | Huotari et al. | |
| 7,105,054 B2 | 9/2006 | Lindfors | |
| 7,108,747 B1 | 9/2006 | Leskela et al. | |
| 7,118,779 B2 | 10/2006 | Verghese et al. | |
| 2001/0003064 A1 | 6/2001 | Ohto | |
| 2001/0018266 A1 | 8/2001 | Jiang et al. | |
| 2001/0025999 A1 | 10/2001 | Suguro | |
| 2001/0041250 A1 | 11/2001 | Werkhoven et al. | |
| 2001/0052318 A1 | 12/2001 | Jiang et al. | |
| 2002/0006468 A1 | 1/2002 | Paranjpe et al. | |
| 2002/0008257 A1 * | 1/2002 | Barnak et al. | 257/262 |
| 2002/0009257 A1 | 1/2002 | Barnak et al. | |
| 2002/0013487 A1 | 1/2002 | Norman et al. | |
| 2002/0014634 A1 | 2/2002 | Koyama et al. | |
| 2002/0027286 A1 | 3/2002 | Sundararajan et al. | |
| 2002/0030235 A1 | 3/2002 | Agarwal et al. | |
| 2002/0037615 A1 | 3/2002 | Matsuo | |
| 2002/0096724 A1 | 7/2002 | Liang et al. | |
| 2002/0102838 A1 | 8/2002 | Paranjpe et al. | |
| 2002/0106536 A1 | 8/2002 | Lee et al. | |
| 2002/0137317 A1 | 9/2002 | Kaushik et al. | |
| 2002/0190302 A1 | 12/2002 | Bojarczuk et al. | |
| 2003/0032281 A1 | 2/2003 | Werkhoven et al. | |
| 2003/0049942 A1 | 3/2003 | Haukka et al. | |
| 2003/0064607 A1 | 4/2003 | Leu et al. | |
| 2003/0072975 A1 | 4/2003 | Shero et al. | |
| 2003/0082296 A1 | 5/2003 | Elers et al. | |
| 2003/0165615 A1 | 9/2003 | Aaltonen et al. | |
| 2003/0201537 A1 | 10/2003 | Lane et al. | |
| 2003/0232510 A1 | 12/2003 | Buchanan et al. | |
| 2004/0005753 A1 | 1/2004 | Kostamo et al. | |
| 2004/0036129 A1 | 2/2004 | Forbes et al. | |
| 2004/0071878 A1 | 4/2004 | Schuhmacher | |
| 2004/0106261 A1 | 6/2004 | Huotari et al. | |
| 2004/0121616 A1 | 6/2004 | Satta et al. | |
| 2004/0175928 A1 | 9/2004 | Abell | |
| 2004/0214354 A1 | 10/2004 | Marsh et al. | |
| 2004/0256662 A1 | 12/2004 | Black et al. | |
| 2005/0009325 A1 | 1/2005 | Chung et al. | |
| 2005/0045092 A1 * | 3/2005 | Wu et al. | 117/92 |
| 2005/0048794 A1 | 3/2005 | Brask et al. | |
| 2005/0089632 A1 | 4/2005 | Vehkamaki et al. | |
| 2005/0092247 A1 | 5/2005 | Schmidt et al. | |
| 2005/0212139 A1 | 9/2005 | Leinikka | |
| 2006/0046384 A1 | 3/2006 | Joo et al. | |
| 2006/0078679 A1 | 4/2006 | Elers et al. | |
| 2006/0121733 A1 | 6/2006 | Kilpela et al. | |
| 2006/0216932 A1 | 9/2006 | Kumar et al. | |
| 2007/0014919 A1 | 1/2007 | Hamalainen et al. | |
| 2007/0026654 A1 | 2/2007 | Huotari et al. | |
| 2007/0036892 A1 | 2/2007 | Haukka et al. | |
| 2007/0148347 A1 | 6/2007 | Hatanpaa et al. | |

FOREIGN PATENT DOCUMENTS

| | | |
|---|---|---|
| EP | 0469470 A1 | 2/1992 |
| EP | 0511264 B2 | 8/1995 |
| EP | 0 854 505 A2 | 7/1998 |
| EP | 0880168 A2 | 11/1998 |
| EP | 1063687 | 12/2000 |
| GB | 2 340 508 A | 2/2000 |
| GB | 2372042 | 8/2002 |
| GB | 2372043 | 8/2002 |
| GB | 2372044 | 8/2002 |
| JP | 2000-058777 | 2/2000 |
| WO | WO 93/10652 | 5/1993 |
| WO | WO 94/14198 | 6/1994 |
| WO | WO 00/03420 | 1/2000 |
| WO | WO 00/47404 | 8/2000 |
| WO | WO 00/47796 | 8/2000 |
| WO | WO 00/54320 | 9/2000 |
| WO | WO 00/61833 | 10/2000 |
| WO | WO 01/29280 A1 | 4/2001 |
| WO | WO 01/29892 A1 | 4/2001 |
| WO | WO 01/29893 A1 | 4/2001 |
| WO | WO 01/40541 A1 | 7/2001 |
| WO | WO 01/66832 A2 | 9/2001 |
| WO | WO 0199166 | 12/2001 |
| WO | WO 02/43115 A2 | 5/2002 |
| WO | WO 02/50922 A1 | 6/2002 |
| WO | WO 2004064147 A | 7/2004 |

WO WO 2004114398 A 12/2004

OTHER PUBLICATIONS

Alén et al., "ALD of Ta(Si)N Thin Films Using TDMAS as a Reducing Agent and as a Si Precursor," *J. Electrochem. Soc..* 151(8): G523-G527 (2004).
Chatterjee et al., "CMOS Metal Replacement Gate Translstors using Tantalum Pentoxide Gate Insulator," IEEE, IEDM, 0-7803-4774-9/98, pp. 777-780 (1998).
Chen et al., "0.18μm Metal Gate Fully-Depleted SOI MOSFETs for Advanced CMOS Applications," Symposium on VLSI Technology Digest of Technical Papers, pp. 25-26 (1999).
Ducroquet et al., "Full CMP Integration of CVD TiN Damascene Sub-0.1-μm Metal Gate Devices For ULSI Applications," IEEE Transactions on Electron Devices 48(8): 1816-1821 (2001).
Elam et al., "Surface Chemistry and Film Growth During TiN Atomic Layer Deposition Using TDMAT and $NH_3$ " *Thin Solid Films* (436):145-156 (2003).
Ferguson et al., "Titanium Nitride Metal Gate Electrode: Effect of Nitrogen Incorporation," Advanced Metallization Conference 2001 (AMC 2001), pp. 115-119.
Ferguson, et al., "Atomic Layer Deposition of Boron Nitride Using a Sequential Exposures of $BCI_3$ and $NH_3$," *Thin Solid Fims* (413): 16-24 (2002).
Hiltunen et al., "Nitrides of Titanium, Niobium, Tantalum and Molybdenum Grown as Thin Films by the Atomic Layer Epitaxy Method," *Thin Solid Films* 166: 149-154 (1988).
Hobbs et al., "Sub-Quarter Micron CMOS Process for TiN-Gate MOSFETs with $TiO_2$ Gate Dielectric formed by Titanium Oxidation," Advanced Products Research and Development Lab, Symposium on VLSI Technology Digest of Technical Papers, pp. 133-134 (1999).
Klaus et al., "Atomic Layer Controlled Growth of $Si_3N_4$ Films Using Sequential Surface Reactions," *Surf. Sci.* (418): L14-L19 (1998).
Lin et al., "An Adjustable Work Function Technology Using Mo Gate for CMOS Devices," *IEEE Electron Dev. Lett.* 23(1): 49-51 (2002).
Lu et al., "Metal Gate Work Function Adjustment for Future CMOS Technology," Symp. VLSI Technology Digest of Technical Papers, pp. 45-46 (2001).
Maiti et al., "PVD TiN Metal Gate MOSFETs on Bulk Silicon and Fully Depleted Silicon-On-Insulator (FDSOI) Substrates for Deep Sub-Quarter Micron CMOS Technology," IEEE, IEDM, 0-7803-4774-9/98, pp. 781-784 (1998).
Michaelson, H. B., "The Work Function of the Elements and its Periodicity," *J. Appl. Phys.* 48(11): 4729-4733 (1977).
Min et al., "The Mechanism of Si Incorporation and the Digital Control of Si Content during the Metallorganic Atomic Layer Deposition of Ti-Si-N Thin Films," *J. Electrochem. Soc.* 147(10): 3868-3872 (2000).
Park et al., "Robust Temary Metal Gate Electrodes for Dual Gate CMOS Devices," IEEE, IEDM, 0-7803-7050-3/02, pp. 671-674 (2001).
Polishchuk, "Dual Work Function Metal Gate CMOS Technology Using Metal Interdiffusion," *IEEE Electron Device Letters* 22(9): 444-446 (2001).
Ritala et al., "Controlled Growth of TaN, $Ta_3N_5$, and $TaO_xN_y$, Thin Films by Atomic Layer Deposition," *J. Chem. Mater.* 11: 1712-1718 (1999).
Suntola, "Atomic Layer Epitaxy," *Handbook of Crystal Growth*, vol. 3, chapter 14, pp. 601-663 (1994).
Wakabayashi et al., "A Novel W/TiNx Metal Gate CMOS Technology using Nitrogen-Concentration-Controlling TiNx Film," IEEE, IEDM, 0-7803-5410-9/99, pp. 253-256 (1999).
Wilk et al., "High-k dielectrics: Current status and materials properties considerations," *Journal of Applied Physics* 89(10): 5243-5275 (2001).
Yagishita et al., "High Performance Damascene Metal Gate MOSFET's for 0.1 μm Regime," *IEEE Transactions on Electron Devices* 47(5): 1028-1034 (2000).
Yagishita et al., "Reduction of Threshold Voltage Deviation in Damascene Metal Gate MOSFETs," IEEE, IEDM, 0-7083-5410-9/99, pp. 257-260 (1999).

Yeo et al., "Dual-Metal Gate CMOS Technology with Ultrathin Silicon Nitride Gate Dielectric," *IEEE Electronic Device Letters* 22(5): 227-229 (2001).
Zhong et al., "Electrical Properties of $RuO_2$ Gate Electrodes for Dual Metal Gate Si-CMOS," *IEEE Electron Device Letters* 21(12): pp. 593-595 (2000).
Zhong et al., "Characterization of $RuO_2$ Electrodes on Zr Silicate and $ZrO_2$ Dielectrics," *Appl. Phys. Lett.* 78(8): 1134-1136 (2001).
U.S. Appl. No. 10/430,703 Office Action mailed Sep. 3, 2004.
U.S. Appl. No. 10/430,703 Office Action mailed Mar. 31, 2005.
U.S. Appl. No. 10/954,806 Office Action mailed Nov. 15, 2005.
1988RD-0296076, "Field effect transistor structure with improved transconductance—contg. Spacer-less conducting gate oxide, and tungsten deposition on source and drain," Anonymous.
Aaltonen et al., "Atomic Layer Deposition of Noble Metal Thin Films," dissertation presented at the University of Helsinki, Helsinki, Finland, 2005.
Aaltonen et al., "Atomic Layer Deposition of Platinum Thin Films," *Chem. Mater.* 15:1924-1928 (2003).
Abeles, et al., Amorphous Semiconductor Superlattices, Physical Review Letters, Vo. 51, No. 21, pp. 2003-2006.
Bai, High K Gate Stack for Sub-0.1 UM CMOS Technology, Electrochemical Society Proceedings, vol. 99-100, pp. 39-44 (1999).
Baliga, J., "New Designs and Materials Tackle 1 Gb Memory Challenge, " Semiconductor International, World Wide Web address: semiconductor.net, Nov. 2000.
Basceri, C., "Electrial Dielectric Properties of (Ba,Sr) $TiO_3$ Thin Films Capacitors for Ultra-High Density Dynamic Random Access Memories", Thesis, 1997.
Del Prado, et al., "Full composition range silicon oxynitride films deposited by ECR-PECVD at room temperature," Thin Solid Films, vol. 344, pp. 437-440 (1999).
Desu, et al, Enhanced Dielectric Properties of Modified $Ta_2O_5$ Thin Films, Mat Res. Innovat (1999) 2:299-302.
Haukka and Root, "The Reaction of Hexamethyldisilazane and Subsequent Oxidation of Trimethylsilyl Groups on Silica Studied by Solid-State NMR and FTIR," *J. Phys. Chem.* 98:1695-1703 (1994).
Haukka et al., "Chemisorption of Chromium Acetylacetonate on Porous High Surface Area Silica," *Appl. Surface Science* 75:220-227 (1994).
Hoyas et al. Growth and Characterization of Atomic Layer Deposited WCO.7NO.3 on Polymer Films,' Journal of Applied Physics, Jan. 1, 2004, 95(1):381-388.
Ihanus, et al, ALE Growth of $ZnS_{1-x}Se_x$ Thin Films by Substrating Surface Sulfur with Elemental Selenium, Applied Surface Science 112 (1997) 154-158.
International Search Report, PCT/US01/06746 (ASMMC.002VPC).
Kaizuka, et al., Conformal Chemical Vapor Deposition TiN (111) Film Formation as an Underlayer of Al for Highly Reliable Interconnects, jpn, J. Appl. Phys. vol. 33 (1994) pp. 470-474.
Kikkawa, et al., A Quarter-Micrometer Interconnection Technology Using a TiN/Al-Si-Cu/TiN/Al-Si-Cu/TiN/Ti Multilayer Structure, IEEE Transactions on Electron Devices, vol. 40, No. 2 Feb. 1993.
Kikkawa, et al., Al-Si-Cu/TiN Multilayer Interconnection and Al-Ge Reflow Sputtering Technologies for Quarter-Micron Devices, 54/SPIE vol. 1805 Submicrometer Metallization (1992).
Kim, et al., The Effects of Substrate and Annealing Ambient on the Electrical Properties of $Ta_2O_5$ Thin Films Prepared By Plasma Enhanced Chemical Vapor Deposition, Thin Film Solids 253 (1994) pp. 453-439.
Klaus et al., "Atomic layer deposition of tungsten using sequential surface chemistry with a sacrificial stripping reaction," *Thin Solid Films* 360, 145-153 (2000).
Koh et al. "Meeting the Cu diffusion barrier challenge using ALD tungsten nitride carbide," *Solid State Technology*, 54-58 (Jun. 2005).
Kukli, et al., Atomic Layer Epitxy Growth of Tantalum Oxide Thin Films from $Ta(OC_2H_5)_5$ and $H_2O$, J. Electochem. Soc. vol. 142, No. 5, May 1995 pp. 1670-1674.
Kwon et al., "Ruthenium Bottom Electrode Prepared by Electroplating for a High Density DRAM Capacitor," J. Electrochem. Soc. 151(2): C127-C132 (2004).
Lai et al., "Precursors for Organometallic Chemical Vapor Deposition of Tungsten Carbide Films," *Chem. Mater*, 7, 2284-2292 (1995).

Leskela, et al., Atomic Layer Epitaxy in Deposition of Various Oxide and Nitride Thin Films, Journal De Physique IV, Colloque C5, Supplement au Journal de Physique II, vol. 5, Jun. 1995.

Liu et al., "Metal Nanocrystal Memories—Part I: Device Design and Fabrication," *IEEE Transactions on Electron Devices* 49(9): 1606-1613 (2002).

Liu et al., "Metal Nanocrystal Memories—Part II: Electrical Characteristics," *IEEE Transactions on Electron Devices* 49(9): 1614-1622 (2002).

Lucovsky, "Integration of Alternative High-K Gate Dielectrics into Aggressively Scaled CMOS Si Devices: Chemical Bonding Constraints at Si-Dielectric Interfaces," Electrochemical Society Proceedings, vol. 99-10, pp. 69-80 (1999).

Maiti, et al., "Improved ultrathin oxynitride formed by thermal nitridation and low pressure chemical vapor deposition process," Applied Physics Letter, vol. 61, No. 15, pp. 1790-1792 (1992).

Martensson, et al., Use of Atomic Layer Epitaxy for Fabrication of Si/TiN/Cu Structures, J. Vac Sci. Technol.B 17(5), Sep./Oct. 1999, pp. 2122-2128.

Min, et al., Atomic Layer Deposition of TiN Films by Alternate Supply of Tetrakis (ethylmethylamino)-Titatium and Ammonia, Jpn. J. Appl. Phys. vol. 37 (1998) pp. 4999-5004.

Min, et al., Atomic Layer Deposition of TiN Thin Films by Sequential Introduction of Ti precursor and $NH_3$ Mat. Res. Soc. Symp. Proc. vol. 514 1996 Materials Research Society.

Nakajima et al. "Chemical Vapor Deposition of Tungsten Carbide, Molybdenum Carbide Nitride, and Molybdenum Nitride Films," *J. Electrochem. Soc.*, vol. 144, No. 6 (Jun. 1997).

Nakajima, et al., "Atomic-layer-deposited silicon-nitride/$SiO_2$ stacked gate dielectrics for highly reliable p-metal-oxide-semiconductor filed-effect transistors," Applied Physics Letters, vol. 77, No. 18, pp. 2855-2857 (2000).

Nakajima, et al., "Low-temperature formation of silicon nitride gate dielectrics by atomic-layer deposition," Applied Physics Letters, vol. 79, No. 5, pp. 665-667 (2001).

Niinisto et al., Synthesis of Oxide Thin Films and Overlayers by Atomic Layer Epitaxy for Advanced Applications, Materials Science and Engineering B41 (1996) 23-29.

Parsons et al., "Microcontact Patterning of Ruthenium Gate Electrodes by Selective Area," North Carolina State university, presentation at AVS conference on Atomic Layer Deposition (ALD 2004), Helsinki, Finland, Aug. 16, 2004.

Ritala, et al, Perfectly Conformal TiN and $Al_2O_3$ Films Deposited by Atomic Layer Deposition, Communications, Chemical Vapor Deposition 1999, 5, No. 1, pp. 7-9.

Ritala, et al., Atomic Layer Epitaxy Growth of tiN Thin Films from $TiI_4$ and $NH_3$, J. Electrochemical Soc., vol. 145, No. 8, Aug. 1998 pp. 2914-2920.

Ritala, et al., Zirconium Dioxide Thin Films Deposited by ALE Using Zirconium Tetrachloride as Precursor, Applied Surface Science, 75 (1994) pp. 333-340.

Sakaue, et al., Digital Chemical Vapor Deposition of $SiO_2$ Using a Repetitive Reaction of Triethylsilanel Hydrogen and Oxidation, Japanese Journal of Applied Physics, vol. 30, No. 1B, Jan. 1990, pp. L124-L127.

Singer, Atomic Layer Deposition Targets Thin Films, Semiconductor International, Sep. 1, 1999, 1 page.

Sneh, et al., Atomic Layer Growth of $SiO_2$ on Si(100) Using $SiCl_4$ and $H_2O$ in a Binary Reaction Sequence, Surface Science 334 (1995) 135-152.

SOI Technology: IMB's Next Advance in Chip Design, 1998.

Tiitta, et al., Preparation and Characterization of Phosphorus-Doped Aluminum Oxide Thin Films, Materials Research Bulletin, vol. 33, No. 9 pp. 1315-1323 1998.

Vehkamaki, et al., Growth of $SrTiO_3$ and $BaTiO_3$ Thin Films by Atomic Layer Deposition, Department of Chemistry. University of Helsinki. FIN-00014. Helsinki, Finland, Electronic and Solid State Letters, 2 (10) (1999) Letters Online.

Wise et al, Diethyldiethoxysilane as a New Precursor for $SiO_2$ Growth of Silicon, Mat. Res. Soc. Symp. Proc. vol. 334, pp. 37-43.

The File Wrapper for U.S. Appl. No. 09/800,757, now U.S. Patent No. 6,534,395, filed Mar. 6, 2001, titled "Method of Forming Graded Thin Films Using Alternating Pulses of Vapor Phase Reactants", listing as inventor Werkhoven et al.

Office Action for U.S. Appl. No. 09/800,757, now U.S. Patent No. 6,534,395 dated Jun. 17, 2002.

The File Wrapper for U.S. Appl. No. 11/868,333, filed Oct. 5, 2007, titled "ALD of Metal Silicate Films", listing as inventor Wang et al.

Office Action for U.S. Appl. No. 11/868,333 dated May 28, 2008.

Schumacher et al., "Integration of ALD WCN Into a Dual Damascene Oxide Module," Advanced Metallization Conference 2002.

* cited by examiner

METHOD OF PRODUCING THIN FILMS

CROSS-REFERENCE TO RELATED APPLICATIONS

The present application is related to U.S. patent application Ser. No. 10/430,703, filed May 5, 2003, and U.S. patent application Ser. No. 10/430,811, filed May 5, 2003, now U.S. Pat. No. 6,858,524, which are hereby incorporated by reference in their entirety.

BACKGROUND OF THE INVENTION

1. Field of the Invention

The present invention relates generally to the field of thin films. In particular, the invention concerns the production of doped nitride thin films. The present invention also comprises a method of modifying electrical and physical properties of nitride thin films produced by ALD (Atomic Layer Deposition). Films produced by the invention can be used in metal gate and metal electrode applications in metal oxide semiconductor field effect transistors (MOSFETs), in capacitor structures in memory applications and in barrier layers in interconnect structures.

2. Description of the Related Art

Atomic layer deposition (ALD) is a self-limiting process, whereby alternated pulses of reaction precursors saturate a substrate surface and leave no more than one monolayer of material per pulse. The deposition conditions and precursors are selected to ensure self-saturating reactions, such that an adsorbed layer in one pulse leaves a surface termination that is non-reactive with the gas phase reactants of the same pulse. A subsequent pulse of different reactants reacts with the previous termination to enable continued deposition. Thus, each cycle of alternated pulses leaves no more than about one molecular layer of the desired material. The principles of ALD type processes have been presented by T. Suntola, e.g. in the Handbook of Crystal Growth 3, Thin Films and Epitaxy, Part B: Growth Mechanisms and Dynamics, Chapter 14, Atomic Layer Epitaxy, pp. 601-663, Elsevier Science B.V. 1994, the disclosure of which is incorporated herein by reference.

In a typical ALD process for depositing thin films, one deposition cycle comprises exposing the substrate to a first precursor, removing unreacted first reactant and reaction byproducts from the reaction chamber, exposing the substrate to a second precursor, followed by a second removal step. Typically, halide precursors, such as $TiCl_4$ and $HfCl_4$, are used as precursors in ALD deposition because those precursors are inexpensive and relatively stable, but at the same time reactive towards different types of surface groups. $H_2O$ and $NH_3$ are widely used for oxide and nitride deposition, respectively, as second precursors.

Atomic Layer Deposition of Ta(+III)N has been very challenging because of the multiple, stable oxidation states of Ta. Conventional ALD TaN processes using halides or metal organic Ta precursors and ammonia produces a dielectric film with Ta oxidation state of +V ($Ta_3N_5$). It is also possible to get stoichiometric TaN with metal halides by using Zn as reducing agent (Ritala, M., Kalsi, P., Riihelä, D., Kukli, K., Leskelä, M. and Jokinen, J., Chem. Mater. 11 (1999) 1712-1718.). However, this process is not favorable in IC industry because of zinc contamination. While metal halides are very stable, metal organic Ta-precursors tend to have poor thermal stability and therefore the film besides having a high resistivity can also have a lot of carbon as contaminant.

Attempts for silicon doping of ALD nitride thin films have been made (Min, J.-S. et al, *J. Electrochem. Soc.* 147 (2000) 3868-3872. However, the metal precursor (TDMAT, tetrakis (dimethylamido)titanium) that Min. et al. are not ideal for ALD deposition as Elam et al. (Elam, J. W., et al., *Thin Solid Films* 436 (2003) 145-156) have discovered. The titanium precursor that Min et al. used decomposes already at very low temperatures <180° C. and thus the deposited film will have too much impurities, for example, carbon and hydrogen. At those temperatures the other precursors, especially ammonia ($NH_3$), is not reactive enough. Also monosilane ($SiH_4$) that Min et al. used is not ideal as an ALD precursor, because it is very stable and not reactive enough. It is not ideal to use that precursor in ALD deposition. The addition of monosilane to the process also decreased the growth rate of the film.

Ta(Si)N films (Alén et al., *J. Electrochem. Soc.* 151 (2004), G523-G527) have been deposited by ALD. The silicon precursor, tris(dimethylamino)silane (TDMAS), that Alén et al. used is known to decompose quite easily at temperatures needed for ALD nitride film deposition. Also films deposited at 300° C. contained as much as 10 at-% chlorine and had resistivities in excess of 0.5 Ωcm. Therefore is TDMAS is not an applicable precursor for silicon doping of ALD nitride thin films.

Several attempts (for example, Klaus et al., *Surf Sci.* 418, (1998) L14-L19) have also been made for ALD of silicon nitride from chloride based silicon precursors, but either the reaction temperature (>500° C.) is too high for metal gate application, which can cause degradation of the gate dielectric layer, and also for barrier layer application in interconnect structures, in which the low-k materials degrades at those temperatures, or the deposition rate per time unit is so slow that there is no use of this process in production or the doses of precursor are extremely large, which will cause severe problems in purging, which again will led to problems like gas-phase growth of the film and generation of particles, the reactor between the pulses Semiconductor devices are continuously improved to enhance device performance. For example, both smaller device size and higher speed of operation are highly desirable performance targets. Transistors have also been continuously reduced in size to lower the power consumption and to increase the clocking frequency. By constructing smaller gate structures for complementary metal oxide silicon (CMOS) transistors, it becomes possible to pack more transistors on the same surface area. The reduction in the size of the gate structures has led to a substantial decrease of the electrical thickness of the gate dielectric to 3 nm and less in today's technologies.

Figure 1:
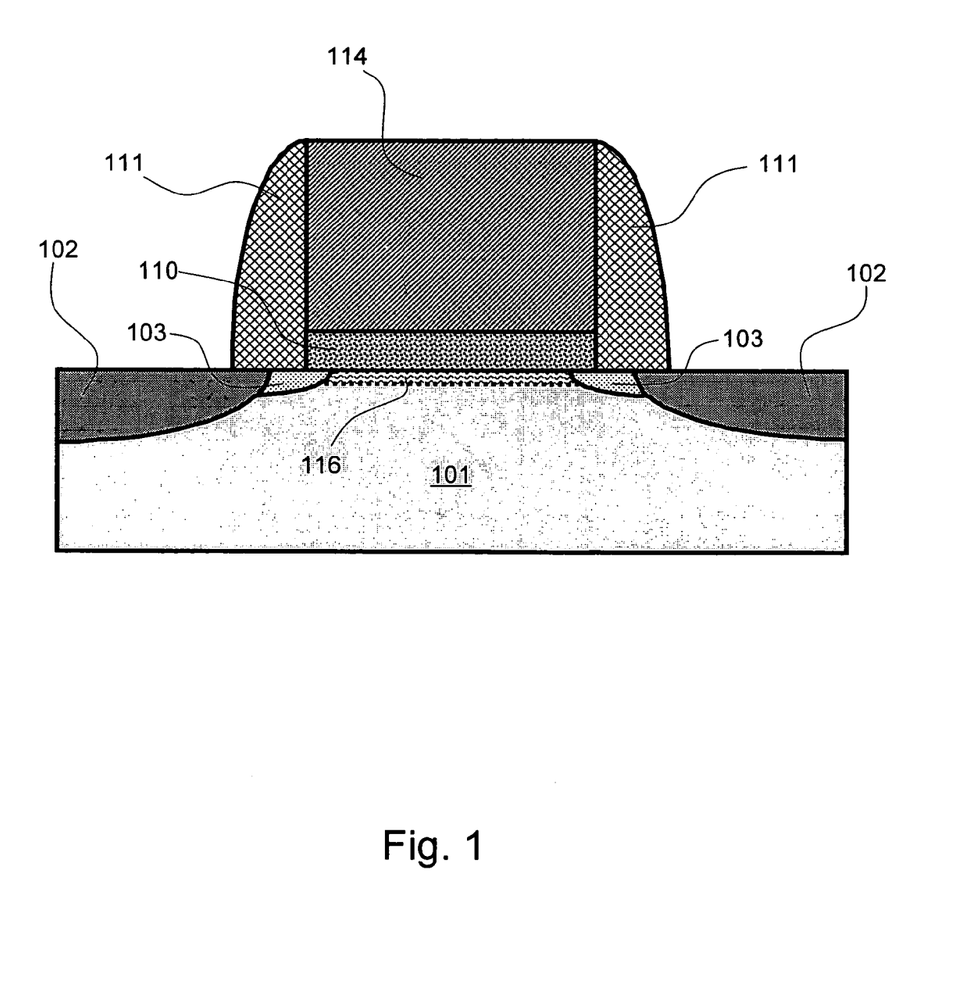
FIG. 1 shows cross-sectional view of a gate stack.

The main elements of a typical MOS semiconductor device are shown in FIG. 1. The device generally includes a semiconductor substrate 101, on which a gate stack is disposed. The gate stack comprises a gate dielectric layer 110 and a gate electrode 114 disposed on the gate dielectric layer 110. The gate electrode 114 acts as a conductor. An input signal is typically applied to the gate electrode 114 via a gate terminal (not shown). Lightly doped drain (LDD) regions 103 reduce the electric field near the drain edge and thus reduce the incident of hot carrier generation. Spacers 111, usually consisting of an insulating oxide, are formed in the sidewalls. Then, heavily doped source/drain regions 102 are formed in the semiconductor substrate 101 and are later connected to source/drain terminals (not shown).

A channel region 116 is formed in the semiconductor substrate beneath the gate dielectric 110 and it separates source/drain regions 102. The channel region is typically lightly doped with a dopant of a type opposite to that of the source/ drain regions 102. The gate electrode 114 is separated from the semiconductor substrate 101 by the gate dielectric layer 110. The insulating gate dielectric layer 110 is provided to prevent current from flowing between the gate electrode 114 and the source/drain regions 102 or the channel region 116. The properties of the transistor critically depend on the thickness and quality of the gate dielectric layer 110.

Figure 3:
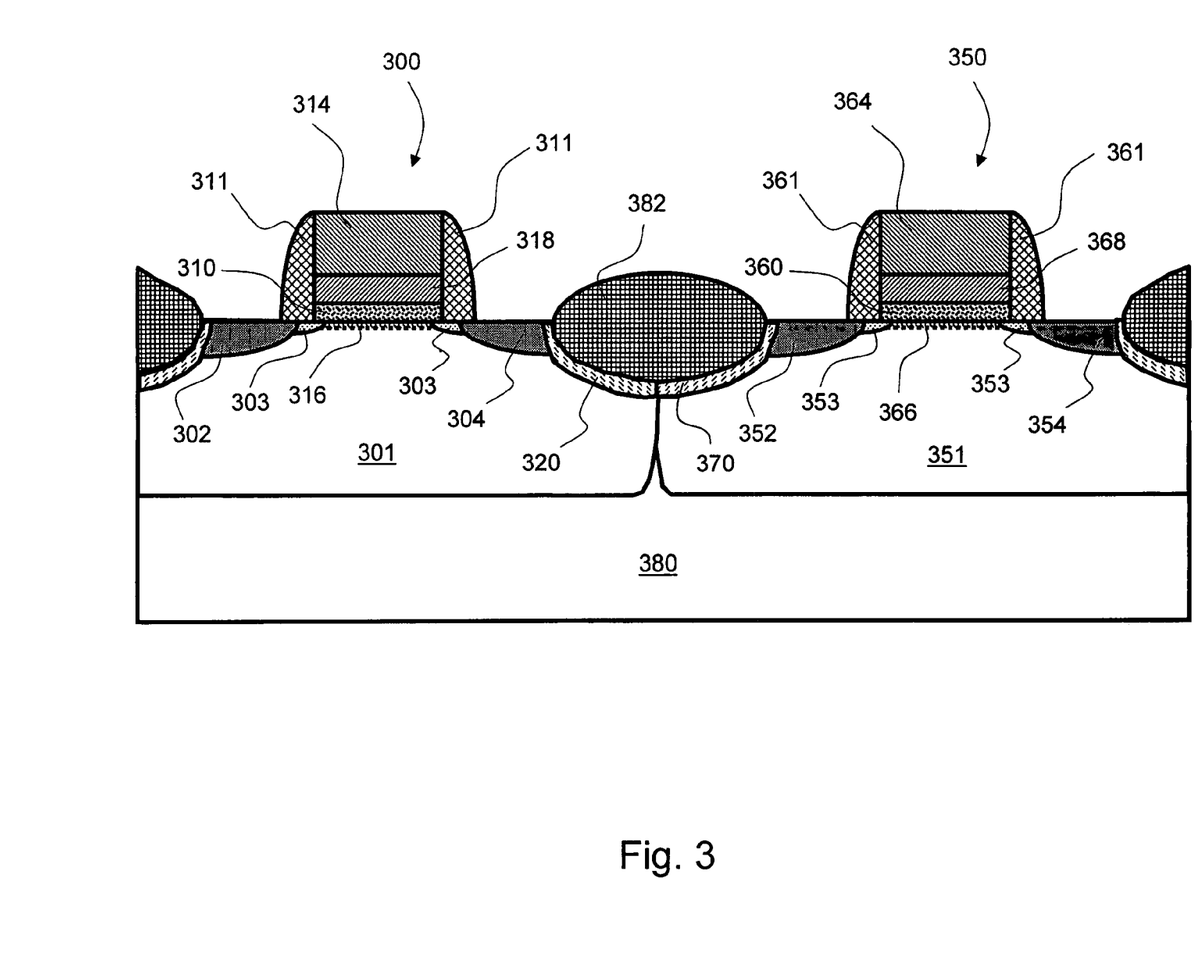
FIG. 3 shows a cross sectional view of a CMOS device of the present invention.

In a CMOS device, opposite type NMOS 300 and PMOS 350 transistors are present as shown in FIG. 3. By applying a voltage to the gate electrodes 314, 364 of the transistors, channel regions 316, 366 become electrically conductive in the lightly doped substrate regions beneath the gate dielectrics 310, 360. The transistor switches from a non-conductive state into a conductive state at the threshold voltage that is applied to the gate electrode. In order to keep the threshold voltages of the transistors small and, hence, to keep the power consumption of the transistors low, the work function of the gate electrode material should be nearly equal to the work function of the substrate material underneath the gate electrode.

P-type and N-type substrate materials have significantly different work functions.

Traditionally, the work function matching was achieved by using polysilicon as gate electrode material and by doping the polysilicon with a dopant. However, in current technology, polysilicon is not adequate anymore because of its too low conductivity and because of depletion effects. Depletion takes place in the semiconducting polysilicon at the gate electrode/gate dielectric interface, increasing the equivalent oxide thickness (EOT) of the gate dielectric. On the other hand, the solubility of the dopants of the polysilicon is limited to about $5 \times 10^{20}$ atoms/cm$^3$. The solubility restricts the amount of charge carriers formed in polysilicon. Therefore, especially in the future more conductive materials, such as refractory metals, e.g. tungsten, are preferred. In practice, metallic materials have an infinite amount of carriers ($5 \times 10^{22}$ atoms/cm$^3$) and therefore the thickness of the depletion region is virtually zero. This leads to a decrease of 4-5 Å of the EOT of the gate dielectric.

The most important property of the metal gate is its work function, which together with the doping level of the substrate determines the threshold voltage of the metal oxide semiconductor device. The work function of the metal electrode material should be about 4.0 to 4.2 eV in NMOS field effect transistors and about 5.0 to 5.2 eV in PMOS field effect transistors.

Features known to influence the work function of the metal electrode material are, in particular:
  the method of depositing the metal electrode,
  heat treatments carried out after the deposition (i.e. RTA, Rapid Thermal Annealing),
  the thickness of the metal electrode layer, the gate oxide material used,
  the crystal orientations and crystallinity of the electrode material, and
  the electronic properties of channel region material The impact of the heat treatments on the work function of the electrode material is possibly due to crystallization of the materials or, for example, to emission of stoichiometrically superfluous nitrogen or some other element from the material during heat treatment. It is known that when a metal is oxidized or nitridized its average electronegativity is increased. Since work functions scale with electronegativity, an increase of the electronegativity also increases the work function.

Attempts have been made to modify the work functions of metal gate materials by doping them after deposition of the metal gate film. However, the work functions of metal gate materials after doping are not easily predictable and controllable. Doping of the gate material after deposition can change not only the stoichiometry of the film but also the crystal orientation of the films (Q. Lu et al., Symp. VLSI Tech. (2001) 45-46 and US Pat. Appl. No. 2002/0008257 A1).

U.S. Pat. No. 6,458,695 B1 discloses a method of adjusting the work function of an electrode by regulating the composition of the material. The publication describes the deposition of metal gates followed by oxidizing or implantation of oxygen into the metal gate electrode for one or both types of transistors so that an alloy is formed of the metal and its conductive oxide, the alloy having a desired work function.

U.S. Pat. No. 6,506,676 discloses a method of changing the work function of an electrode comprising titanium, aluminum and nitrogen by changing the composition of $(Ti_xAl_y)_{1-z}N_z$. According to the method, atomic layer deposition can be used for changing the composition of the film. During the time between cycles when the $(Ti_xAl_y)_{1-z}N_z$ film is deposited using the precursors, one of $NH_3$, $N_2$ and $ND_3$ may be used for purging materials in order to adjust the nitrogen (N) content. At this time, the composition of nitrogen (N) is controlled by the number of each of the cycles.

U.S. Pat. No. 6,518,106, Ngai et al., discloses a method of changing the composition and, thus, the work function of a gate electrode in a transistor with ALD by changing the concentration of one element in the gate electrode material. According to the method of U.S. Pat. No. 6,518,106 B2 the work function of a metal gate layer is changed when the concentration of silicon or nitrogen is changed in layers that contain metal, silicon and nitrogen (e.g. TaSiN). Atomic layer deposition (ALD), chemical vapor deposition (CVD) and physical vapor deposition (PVD) have been disclosed as examples of methods for depositing the metal gate layer. However, a method of avoiding local concentration variations over the substrate is not disclosed.

Ru—Ta-alloys have also been studied for use as gate electrodes. In the studies performed, the work function of the ruthenium-tantalum metal electrodes could be adjusted to a value between 4.2 and 5.1 eV by using different Ru—Ta compositions. The work function of metal electrodes containing more ruthenium was close to 5 eV and an electrode with the composition $Ru_{0.60}Ta_{0.40}$ had a work function of about 4.3 eV (H. Zhong et al. Appl. Phys. Lett. 78 (2001) 1134-1136). However, the electrodes were formed by PVD method, resulting in sputtering damage on the gate stack dielectric layer and, furthermore, causing non-uniformities in electrical and physical properties of ultra-thin films over the substrate.

Tuning of the work function of an electrode can also be achieved by a two-layer electrode structure, each layer having a different work function as described in a U.S. Pat. No. 6,373,111. When the bottom electrode layer is thin, particularly below 3 nm, the work function of the electrode structure will primarily be determined by, and be equal to, the work function of the top layer. When the bottom layer is thick, e.g. above 10 nm, the work function of the electrode structure will primarily be determined by, and equal to, the work function of the bottom layer. In a transition region, between 3 and 10 nm, the work function of the electrode structure can be adjusted between the work function of the top layer and the work function of the bottom layer by adjusting the thickness of the bottom film.

Crystal orientation has a significant effect on the work function of the gate electrode. For example, tungsten with a crystallite orientation of 110 (W<110>) has a maximum work function value of 5.25 eV and W<113> a minimum work function value of 4.18 eV (H. B. Michaelson, J. Appl. Phys. 48 (1977) pp. 4729-4733). This indicates that it is theoretically possible to make both gate electrodes of CMOS devices from the same material, because the acceptable limit is 4.0-4.2 eV for NMOS and 5.0-5.2 eV for PMOS.

It has been observed that by implanting the gate electrode material with 1-2 at.-% of nitrogen and after some annealing the work function value of the gate electrode changed so much that the change could not be explained by only the increased nitrogen concentration (R. Lin et al., IEEE Electron Dev. Lett. 23 (2002) pp. 49-51).

A problem associated with the known methods of tuning the work function of a gate stack is that several variables are involved simultaneously, which makes it very difficult to control the tuning. The composition of the gate electrode is one of the major factors affecting the work function. However, gate electrode layers having the same thickness and same chemical compositions, but deposited by different depositing techniques, such as PVD and ALD, still have different work functions. Another problem of the above-described methods is that adequate control of film composition, uniformities and profiles, or thickness cannot be achieved. Further, when the gate electrode material is contacted with an oxidizing ambient, the gate dielectric material is also subjected to the oxidizing ambient, which might detrimentally affect the dielectric material and oxidize the underlying substrate material.

The PVD method for metal gate deposition has several disadvantages; it can destroy the underlying gate dielectric and ruin the electrical properties of the transistor. Deposition of ultra thin and uniform films over the large surface area substrate is not possible; and due to poor step coverage the deposition of metal gates for three-dimensional transistor structures, like FinFET and tri-gate structures, is not possible at all. Therefore, a better deposition method, like ALD, which does not suffer from any of these disadvantages, is needed.

There is a need for a method of adjusting the work function of a gate electrode material in a gate stack and a method that avoids the above-described disadvantages.

SUMMARY OF THE INVENTION

The present invention is based, in part, on the finding that it is possible effectively to lower the work function of the metal gate and to reduce crystallinity of the film thus obtained by doping ALD nitride thin films with silicon or boron or a combination thereof. As an example, decreased crystallinity is beneficial in barrier layer application in interconnect structures of such films, because the grain boundaries in the film will serve as diffusion paths for copper atom.

In one aspect of the invention, methods for deposition of silicon or boron doped metal nitride thin films are provided. It can be noted that pure boron nitride has been deposited by ALD from boron trichloride ($BCl_3$) and ammonia ($NH_3$) (Ferguson, J. D. et al., Thin Solid Films 413 (2002) 16-24). However, silicon or boron doping of ALD nitride thin films is not known in the art.

Based on the above, the present invention provides, in some embodiments, methods of fabricating a semiconductor device by a combination of the following general steps: forming a gate dielectric layer over a semiconductor substrate; forming a gate electrode over the gate dielectric; and tuning the work function of said gate electrode to a desired value by silicon or boron doping of the material. Methods are also provided for depositing metal electrodes in metal-insulator-semiconductor (MIS) or metal-insulator-metal (MIM) capacitor structures.

In other embodiments, processes for producing metal nitride thin films having enhanced barrier properties are provided. The processes preferably comprise doping by Atomic Layer Deposition the metal nitride thin films with silicon or boron or a combination thereof.

Considerable advantages are associated with the methods provided herein. Some of these advantages include:
There are few, if any, carbon impurities in the films;
Si- or B-doping of metal nitride films is highly controlled and massive doses of dopants are not needed;
Reaction of Si- or B-doping precursors is fast.
Reaction temperatures over 300° C. are possible;
Thermally more stable films are obtained by the addition of silicon or boron to the films;
The work function of ALD metal nitride thin films in metal electrode applications can efficiently be tuned; and
Crystallinity and texture of ALD metal nitride thin films can be suppressed.

Next various embodiments of the invention will be examined more closely with the aid of a detailed description and a number of working examples.

DETAILED DESCRIPTION OF THE PREFERRED EMBODIMENT

In context of the present invention, "an ALD process" generally refers to a process for producing thin films over a substrate, in which process a solid thin film is formed molecular layer by molecular layer due to self-saturating chemical reactions on heated surfaces. In the process, gaseous reactants, i.e. precursors, are conducted into a reaction chamber of an ALD type of a reactor and contacted with a substrate located in the chamber to provide a surface reaction. The pressure and the temperature of the reaction chamber are adjusted to a range where physisorption (i.e. condensation of gases) and thermal decomposition of the precursors are avoided. Consequently, only up to one monolayer (i.e. an atomic layer or a molecular layer) of material is deposited at a time during each pulsing cycle. The actual growth rate of the thin film, which is typically presented as Å/pulsing cycle, depends, for example, on the number of available reactive surface sites on the surface and bulkiness of the chemisorbing molecules. Gas phase reactions between precursors and any undesired reactions of by-products are inhibited because material pulses are separated from each other by time and the reaction chamber is purged with an inactive gas (e.g. nitrogen or argon) between material pulses to remove surplus gaseous reactants and reaction byproducts from the chamber. The principles of ALD type processes have been presented by T. Suntola, e.g. in the Handbook of Crystal Growth 3, Thin Films and Epitaxy, Part B: Growth Mechanisms and Dynamics, Chapter 14, Atomic Layer Epitaxy, pp. 601-663, Elsevier Science B.V. 1994, the disclosure of which is incorporated herein by reference Examples of suitable arrangements of reactors used for the deposition of thin films according to the processes of the present invention are, for instance, commercially available ALD equipment, such as the F-120, F-450 and Pulsar™ reactors, produced by ASM International N.V. In addition to these ALD reactors, many other kinds of reactors capable for ALD growth of thin films, including CVD reactors equipped with appropriate equipment and means for pulsing the precursors, can be employed for carrying out the processes of the present invention. The growth processes can optionally be carried out in a cluster tool, where the substrate arrives from a previous process step, the metal film is produced on the substrate, and then the substrate is transported to the following process step. In a cluster tool, the temperature of the reaction space can be kept constant, which clearly improves the throughput compared to a reactor in which is the substrate is heated up to the process temperature before each run.

A stand-alone reactor can be equipped with a load-lock. In that case, it is not necessary to cool down the reaction space between each run.

In some embodiments, methods of fabricating a semiconductor device have the steps of:

depositing a gate dielectric layer over a semiconductor substrate;

forming a gate electrode comprising a lower part and an upper part over the gate dielectric layer, the gate dielectric layer and the gate electrode forming a gate stack; and tuning overall electronegativity of the lower part of the gate electrode to provide a desired value of work function of the gate stack.

At least the lower part of the gate electrode is formed by an atomic layer deposition (ALD) type process comprising one or more deposition cycles. Each deposition cycle preferably comprises a sequence of alternating and repeated exposure of the substrate to two or more different vapor phase reactants to form an elemental metal film or a compound film of at least binary composition. The work function of the lower part of the electrode is tuned, i.e. set to a predetermined value (in particular embodiments the work function is reduced) by introducing at least one pulse of a precursor of silicon or boron or a combination thereof in or between selected deposition cycles for depositing the gate electrode material.

For the formation of the lower part of the gate electrode it is possible to use conventional ALD, as discussed above, or a process selected from the group of Radical Assisted Atomic Layer Deposition (RA-ALD, remote plasma discharge) and Plasma Enhanced Atomic Layer Deposition (PEALD, in situ plasma discharge). The latter processes are discussed and described in more detail in U.S. patent application Ser. No. 10/430,703, mentioned above.

Several preferred embodiments of the present invention will now be described in detail with reference to the accompanying drawings.

Figure 2:
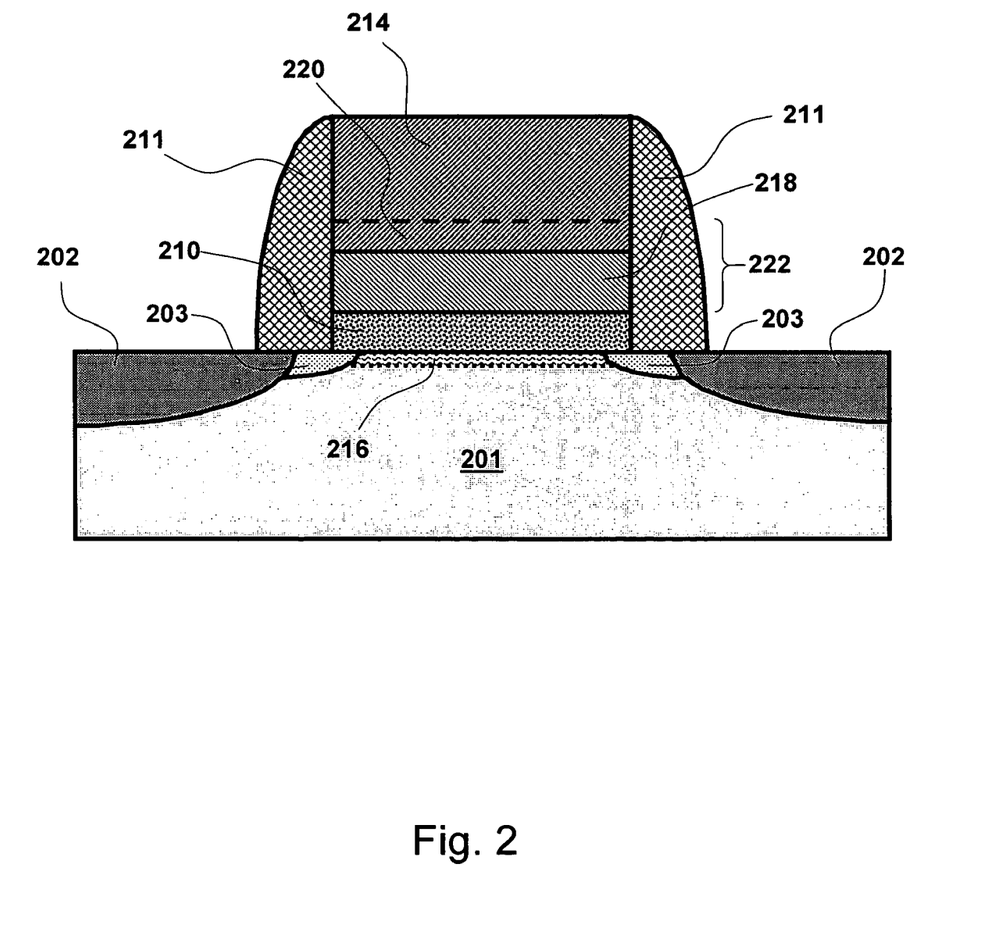
FIG. 2 shows a cross-sectional view of a device of the present invention.

FIG. 2 shows a cross-sectional view of a semiconductor device prepared according to embodiments of the present invention.

In some embodiments, a method of forming a semiconductor device comprises depositing a gate dielectric layer 210 over a semiconductor substrate 201, and depositing gate electrode layers 214, 218 over the gate dielectric layer 210. The semiconductor substrate 201 preferably comprises one or more layers that modify the surface of the substrate or the interface of the substrate and the gate dielectric layer 210. The gate dielectric 210 may be deposited according to any known thin film deposition technique and it is typically formed of a high-k material. One preferred high-k material is hafnium oxide ($HfO_2$).

The gate electrode layer preferably comprises two parts, a lower part 218 and an upper part 214. The lower part 218 and upper part 214 can comprise the same material or different materials. The lower part 218 has an influence on the work function of the electrode layer and therefore on the threshold voltage of the device. The work function and therefore the threshold voltage of the device are determined by the work function adjustment region 222 in the gate stack, which is located in the region of about 0-200 Å above the gate dielectric layer, preferably in the region of about 0-100 Å above the gate dielectric layer (as disclosed, for example, in U.S. Pat. No. 6,373,111). The work function can be adjusted by changing the overall electronegativity of the material in the region 222 that determines the work function of the gate electrode. A lower portion of the upper part of the gate electrode 214 can be a part of the work function adjustment region 222. In some embodiments the thickness of the lower part of the gate electrode layer 218 is from 0 to about 200 Å.

The gate dielectric layer and at least the lower part 218 of the gate electrode layer are preferably deposited by atomic layer deposition (ALD), radical assisted atomic layer deposition (RA-ALD), or plasma enhanced atomic layer deposition (PEALD). The upper part of the gate electrode 214 may be deposited by any known deposition technique.

The materials of the gate dielectric layer and the gate electrode layer are selected to form a suitable pair of layers, which together provide a device having a threshold voltage within a desired range suitable for a thin film transistor. The dielectric-electrode pair may be constructed of a layer of hafnium oxide and a layer of titanium-aluminum-nitride or of a layer of hafnium oxide and a layer of oxygen doped transition metal nitride. According to the methods of the preferred embodiments, the gate dielectric layer and the gate electrode layer are preferably deposited by ALD, RA-ALD or by PEALD without air exposure in between the deposition steps. The surface of the dielectric layer is preferably provided with favorable active surface sites, such as —OH and —$NH_x$ groups. In the preferred embodiment, the negative impact of air exposure on the chemical and physical properties of the lower parts of the device can be avoided by using one single pump down in the deposition process of the dielectric layer and the lower part of the electrode.

The embodiment of FIG. 3 was already briefly discussed above. In more detail, the figure shows a schematic side view of the CMOS structure with an NMOS transistor 300 and a PMOS transistor 350 comprising gate stacks produced according to a preferred embodiment of the present invention. A p-well 301 and an n-well 351 are formed by doping on a p- or an n-type substrate 380. A Single crystal silicon substrate is typically used as the substrate 380. A field oxide 382 with the n-channel stop 320 and the p-channel stop 370 separates the transistors from each other. A lightly doped drain (LDD) 303, 353 extends to the side of the channel region 316, 366. Source/drain areas 302, 304 (NMOS), 352, 354 (PMOS) are heavily doped to improve the electrical conductivity of the material. The gate stack consists of a gate dielectric 310, 360, a lower gate electrode 318, 368 and an upper gate electrode 314, 364. There are side wall oxides 311, 361 by the gate stack for electrical isolation purposes.

In one preferred embodiment, the gate electrode is deposited in two parts to provide a lower part of the electrode comprising a first material having first work function and the upper part of the electrode comprising a second material having second work function, one of the first and second work functions being larger than the desired work function and the other of the second or first work function being smaller than the desired work function. The thickness of the lower part of the electrode is adjusted such that the composite gate electrode formed thereof has a desired work function at its interface with the gate dielectric.

The process for the formation of at least the lower part of the gate electrode comprises an alternating and repeated exposure of the substrate to at least two vapor phase reactants so that a elemental metal film or a compound film of at least binary composition is formed. At least one of the reactants is preferably a metal precursor. In preferred embodiments a metal nitride film is formed and at least one of the reactants comprises a nitrogen precursor. The work function of the lower part of the gate electrode is tuned by adjusting the sequence of alternating and repeating reactant exposure. Adjusting the sequence means in the present context that an additional reactant is added to the deposition sequence (i.e. the metal nitride is doped with a third element).

Preferably the metal precursor is a halide, more preferably a chloride. The metal is selected from the non-limiting group of transition metals, preferably from the group consisting of niobium, tantalum, titanium, tungsten, hafnium, zirconium, vanadium, chromium and molybdenum.

In preferred embodiments the second reactant contains nitrogen so as to provide a metal nitride as the binary compound. A typical nitrogenous reactant is ammonia or hydrazine, although it is possible to use organic derivatives, such as amine compounds. Nitrogen and hydrogen containing plasma, such as plasma formed from $NH_3$ or $N_2/H_2$ mixture can also be used.

As will be discussed in more detail in connection with the examples below, some interesting advantages are obtained by using niobium as the metal component of a metal nitride.

The doping of the metal nitride films is controlled by inserting a desired, i.e. a "preselected" number of pulses of boron or silicon reactants ("additional pulses") and pulses of ammonia or nitrogen and hydrogen containing plasma into the metal nitride deposition process.

The silicon or boron precursors that are used preferably comprise at least one halide atom as a ligand, preferably a chlorine atom. Generally, the doping element precursor comprises a compound having the formula I $$R^1_p AX_q \qquad \qquad I$$

wherein A stands for silicon or boron;
  $R^1$ stands for an organic ligand bonded to A by a carbon-A bond;
  X stands for halo;
  q is an integer having a value in the range from 1 to the valence of A; and
  p is an integer having a value in the range from 0 to q−1.

Preferably q has a value in the range from 2 to the valence of A and X is selected from the group of chloro, bromo, iodo and fluoro. The organic ligand $R^1$ can be selected from the group of
  linear or branched $C_1$-$C_{20}$ alkyl, alkenyl or alkynyl groups;
  halogenated alkyl, alkenyl or alkynyl groups, wherein at least one hydrogen atom is replaced with fluorine, chlorine, bromine or iodine atom;
  carbocyclic groups; and
  heterocyclic groups.

Some particularly preferred embodiments utilize silicon compounds selected from the group of chlorosilanes and alkyl-substituted chlorosilane. Examples of chlorosilanes include dichlorosilane ($SiCl_2H_2$) and organic derivates of silanes include dimethyldichlorosilane ($Si(CH_3)_2Cl_2$). Most preferably the silicon precursor is $SiCl_4$.

According to preferred embodiments, the doping of metal nitride films is achieved by inserting a desired or preselected number of pulses of silicon precursor and/or boron precursor, as exemplified by $SiCl_4$ and/or $BCl_3$, and pulses of ammonia ($NH_3$) or nitrogen and hydrogen containing plasma into the metal nitride process. Preferably the pulse and purge times of $NH_3$ or nitrogen and hydrogen containing plasma after $SiCl_4$ and/or $BCl_3$ pulses (or pulses of other corresponding silicon or boron precursors), are moderately longer, preferably 2-20 times or longer, than in basic metal nitride ALD cycles. However, in some cases the pulse and purge times of $NH_3$ or nitrogen and hydrogen containing plasma after $SiCl_4$ and/or $BCl_3$ pulses (or pulses of corresponding silicon or boron precursors) can be as long as or shorter than in basic metal nitride ALD cycles. Shortening of $NH_3$ pulses can be done in order to increase the growth rate per time unit of the deposition process.

According to one embodiment deposition of NbN (Hiltunen, L., Leskelä, M., Mäkelä, M., Niinistö, L., Nykänen, E. and Soininen, P., *Thin Solid Films* 166 (1988) 149-154) and Nb(Si)N by ALD from $NbCl_5$, $SiCl_4$ and $NH_3$ is used for replacing the ALD TaN based processes in metal electrode or barrier layer applications in interconnects. An advantage of $NbCl_5$ is that it can more readily be reduced to oxidation state +III than $TaCl_5$.

In ALD of NbN, a niobium precursor, such as $NbCl_5$ or $NbF_5$, is introduced into a reaction space where it reacts with, i.e. chemisorbs to, the active surface sites, like —OH-groups, of the substrate, such as $HfO_2$. Usually, although not necessarily, some of the ligands will undergo reaction with surface groups and form reaction byproducts, such as HCl which is formed from a —OH-group and a Cl-ligand. After introduction of the niobium precursor, the reaction space is purged and/or evacuated, so that most, but not necessarily all, of the precursor molecules and by-product molecules are no longer present in the gas phase of the reaction chamber.

After this step a nitrogen containing precursor, such as $NH_3$ or nitrogen and hydrogen containing plasma, is introduced into the reaction space where it usually, but not necessarily always, reacts with the ligands, such as Cl, of the chemisorbed niobium precursor molecule and forms reaction by-products, such as HCl, and also at the same time a chemical bond between a niobium atom and nitrogen atoms. By stripping the chlorine from the niobium precursor molecule, $NH_3$ or nitrogen and hydrogen containing plasma will also reduce the niobium oxidation state of +V at least partially to lower oxidation states, such as +III.

After introducing the nitrogen containing precursor, the reaction space is purged and/or evacuated, so that most, but not necessarily all, of the precursor molecules and by-product molecules are removed from the gas phase of the reaction chamber. This will leave the substrate surface terminated with active surface sites, like —$NH_x$-groups, in preparation for the next niobium precursor pulse. After these steps the substrate is partially covered with one molecular layer of NbN. This described deposition cycles is repeated until the desired thickness of the film is reached.

Next, silicon or boron doped NbN is deposited according to the methods disclosed herein. For example, in ALD of Nb(Si)N the niobium precursor, such as $NbCl_5$ or $NbF_5$, is introduced into reaction space where it reacts i.e. chemisorbs with the active surface sites, like —OH-groups, of the substrate, such as $HfO_2$. Usually, but not necessarily, some of the ligands will undergo reaction with surface groups and form reaction byproducts, like HCl from —OH-group and Cl-ligand. After introducing the niobium precursor the reaction space is purged and/or evacuated, so that most, but not necessarily all, of the precursor molecules and by-product molecules are no longer present in the gas phase of the reaction chamber.

After this step a nitrogen containing precursor, such as $NH_3$ or nitrogen and hydrogen containing plasma, is introduced into reaction space where it usually, but not necessarily always, reacts with the ligands, such as Cl, of the chemisorbed niobium precursor molecule to form reaction by-products, such as HCl, and also at the same time a chemical bond between niobium atoms and nitrogen atoms. By stripping of the chlorine from the niobium precursor molecule, $NH_3$ or nitrogen and hydrogen containing plasma will also reduce the niobium oxidation state of +V at least partially to lower oxidation states, such as +III.

After introducing the nitrogen containing precursor the reaction space is purged and/or evacuated, so that most, but not necessarily all, of the precursor molecules and by-product molecules are removed from the gas phase of the reaction chamber. This will leave the substrate surface terminated with active surface sites, like $—NH_x$-groups, in preparation for a silicon precursor pulse. A silicon precursor, such as $SiCl_4$, reacts i.e. chemisorbs with the active surface sites, like $—NH_x$-groups, of the substrate and usually, but not necessarily, some of the ligands will undergo reaction with surface groups and form reaction byproducts, like HCl from $—NH_x$-group and Cl-ligand. After introducing the silicon precursor the reaction space is purged and/or evacuated, so that most, but not necessarily all, of the precursor molecules and by-product molecules are no longer present in the gas phase of the reaction chamber.

After this step the nitrogen containing precursor, such as $NH_3$ or nitrogen and hydrogen or hydrogen containing plasma, is introduced into reaction space where it usually, but not necessarily, reacts with the ligands, such as Cl, of the previously adsorbed silicon precursor molecules and will form reaction by-products, such as HCl, and also at the same time a chemical bond between silicon atoms and nitrogen atoms. After introducing the nitrogen containing precursor the reaction space is purged and/or evacuated, so that most, but not necessarily all, of the precursor molecules and by-product molecules are removed from the gas phase of the reaction chamber. This will leave the substrate surface terminated with active surface sites, like $—NH_x$-groups, for the first phase of next deposition cycles i.e. niobium precursor pulse.

After these steps the substrate is partially covered with one molecular layer of Nb(Si)N. This described deposition cycles are repeated until the desired thickness of the film is reached. In preferred embodiments, the silicon precursor and following nitrogen precursor pulses are not present in each deposition cycle. That is, in some deposition cycles, the silicon precursor pulses and nitrogen precursor pulse and purge steps between them are omitted. For example, in some embodiments the silicon precursor pulse and the following nitrogen precursor pulse and the related purge steps are introduced only in every fifth deposition cycle.

The reaction temperature for both NbN and Nb(Si)N reactions is preferably, but not necessarily, from about 100-600° C., more preferably from about 300-500° C. However, when nitrogen and hydrogen containing plasma is used as a nitrogen containing precursor, the reaction temperature for both NbN and Nb(Si)N deposition reactions is preferably, but not necessarily, from about 20-400° C., more preferably from about 100-350° C. Optimized pulse and purge times are typically in the range of about 0.01 s to 60 s, but can also be outside of this range if needed, as can be readily determined by the skilled artisan. This can be the case, for example, when depositing films on extreme structures, such as where superior step coverage is desired over extremely high aspect ratio structures or otherwise complicated structures, like in Micro-Electro-Mechanical Systems (MEMS). In more typical situations the pulse times are preferably about 0.05-5 seconds, and purge times from about 1 to 10 seconds.

The niobium precursor is preferably a niobium halide, most preferably a niobium chloride, and the nitrogen precursor is preferably ammonia. The silicon precursor preferably has at least one halide ligand. More preferably all of the ligands of the silicon precursor are halides. In particularly preferred embodiments the silicon precursor is silicon tetrachloride ($SiCl_4$).

Based on the above, the general pulsing sequence for boron or silicon doped metal nitride thin film deposition can be, for example:

$$[n_1 \times (MCl_x + purge + NH_3 + purge) + m_1 \times (SiCl_4 \text{ or } BCl_3 + purge + NH_3 + purge)] \times k_1$$

wherein $n_1$ is the number of nitride cycles in one total cycle,
$m_1$ is the number of doping cycles in one total cycle,
$k_1$ is the number of total cycles, and
M is a metal atom
The pulsing sequence for Nb(Si)N can be for example:

$$[n_2 \times (NbCl_5 + purge + NH_3 + purge) + m_2 \times (SiCl_4 + purge + long\ NH_3 + long\ purge)] \times k_2$$

wherein $n_2$ is the number of nitride cycles in one total cycle,
$m_2$ is the number of doping cycles in one total cycle, and
$k_2$ is the number of total cycles
Or $$[n_3 \times (NbCl_5 + purge + nitrogen\ and\ hydrogen\ containing\ plasma + purge) + m_3 \times (SiCl_4 + purge + nitrogen\ and\ hydrogen\ or\ hydrogen\ containing\ plasma + purge)] \times k_3$$

wherein $n_3$ is the number of nitride cycles in one total cycle,
$m_3$ is the number of doping cycles in one total cycle, and
$k_2$ is the number of total cycles
when plasma is used as nitrogen containing precursor.
A pulsing sequence for Ti(B)N can be, for example:

$$[n_3 \times (TiCl_4 + purge + NH_3 + purge) + m_3 \times (BCl_3 + purge + NH_3 + purge)] \times k_3$$

wherein $n_3$ is the number of nitride cycles in one total cycle,
$m_3$ is the number of doping cycles in one total cycle, and
$k_3$ is the number of total cycles.

In the above equations, each symbol $n_1$ to $n_3$, $m_1$ to $m_3$ and $k_1$ to $k_3$ independently can stand for an integer 1 to 100,000, typically 5 to 10,000, depending on the desired thickness of the thin film. The ratio of the symbol n to the corresponding symbol m is generally about 0.01 to 1,000, in particular about 0.1 to 10. Preferably, the ratio is greater than 1, e.g. about 1.1 to 10.

The following non-limiting examples illustrate the invention:

EXAMPLE 1

ALD hafnium oxide thin films deposited on native silicon oxide were used as a substrates for NbN and Nb(Si)N deposition. Substrates were loaded in an ASM F-120™ reactor.

NbN film was deposited by ALD from $NbCl_5$ and $NH_3$. Nb(Si)N film was deposited by ALD with a pulsing ratio of 5:1 metal nitride cycles to cycles including the Si dopant, from $NbCl_5$, $SiCl_4$ and $NH_3$ precursors (i.e. where n=5 and m=1 and k=100 in the equation presented above). Table 1 shows the rest of both deposition process parameters. Films deposited with these parameters were repeatable and uniform with low impurity contents (impurity levels that are typical for this kind of research reactor).

TABLE 1

Parameters of ALD NbN and Nb(Si)N process.

| Parameter | Parameter value |
|---|---|
| Reaction temperature | 400° C. |
| NbCl$_5$ pulse | 0.5 s |
| NbCl$_5$ purge | 2.0 s |
| NbCl$_5$ temperature | 90° C. |
| NH$_3$ pulse | 1.0 s |
| NH$_3$ purge | 3.0 s |
| NH$_3$ flow rate | ~40 sccm |
| SiCl$_4$ pulse | 0.5 s |
| SiCl$_4$ purge | 5.0 s |
| SiCl$_4$ flow rate | roughly 20 sccm |
| NH$_3$ pulse (after SiCl$_4$) | 5.0 s |
| NH$_3$ purge (after SiCl$_4$) | 20.0 s |

The growth rates of NbN and Nb(Si)N were 0.25 and 0.34 Å/cycle, respectively, as measured with X-Ray Reflection (XRR) and spectroscopic ellipsometer. Roughness and density of 12.5 nm (or 500 cycles) NbN film were determined by XRR to be 2 nm and 8:21 g/cm$^3$, respectively. Resistivity of a 12.5 nm NbN film was 750 μΩcm. Incorporation of SiCl$_4$ into the deposition process increased the resistivity of the Nb(Si)N film.

Nb(Si)N film contained 3 at-% silicon (Table 2). The work function was slightly lowered with incorporation of only 3 at-% silicon into the film. Thermal stability (in thermal anneals) was also enhanced due to incorporation of Si into film. Also the level of crystallinity of Nb(Si)N films measured with X-Ray Diffraction (XRD) was decreased compared to NbN films.

TABLE 2

Elemental concentrations of NbN and Nb(Si)N (Nb:Si = 5:1) films determined with Time-of-Flight Elastic Recoil Detection Analysis (TOF-ERDA).

|  | NbN (at-%) | Nb(Si)N (at-%) |
|---|---|---|
| Nb | 40.8 | 38.8 |
| N | 52.0 | 51.6 |
| Si | — | 3.0 |
| Cl | 4.6 | 1.2 |
| O | 1.3 | 5.0 |
| H | 0.2 | 0.1 |
| C | 0.1 | 0.1 |

EXAMPLE 2

NbN and Nb(Si)N layers were deposited in an F-450 ALCVD™ reactor. Full size 200 mm silicon wafers were used in as substrates. Deposition was carried out at 400° C. either on a thick HfO$_2$ film (40-70 nm) or on native or thermal SiO$_2$. A source temperature of 75-95° C. was used for the NbCl$_5$ reactant.

Figure 4:
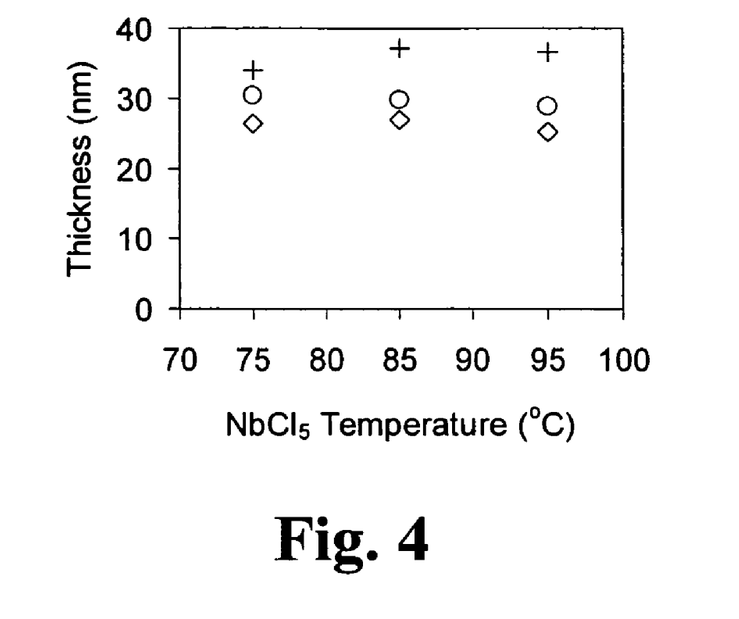
FIG. 4 shows average (○), maximum (+) and minimum (◇) thicknesses of 200 mm NbN films (1000 cycles) as a function of $NbCl_5$ source temperature.

A growth rate of 0.3 Å/cycle was obtained for NbN on 200 mm wafers in the F-450 reactor. The average film thickness and uniformity on 200 mm wafers stayed nearly constant in spite of the change in the NbCl$_5$ dose, indicating the self-limiting (ALD) nature of the growth (see FIG. 4). Roughness and density of 12.5 nm (or 500 cycles) NbN film were determined by XRR to be 2 nm and 8.21 g/cm$^3$, respectively. ALD deposited NbN had a density of 8.21 g/cm$^3$, which is very close to the bulk NbN density of 8.47 g/cm$^3$.

Figure 5:
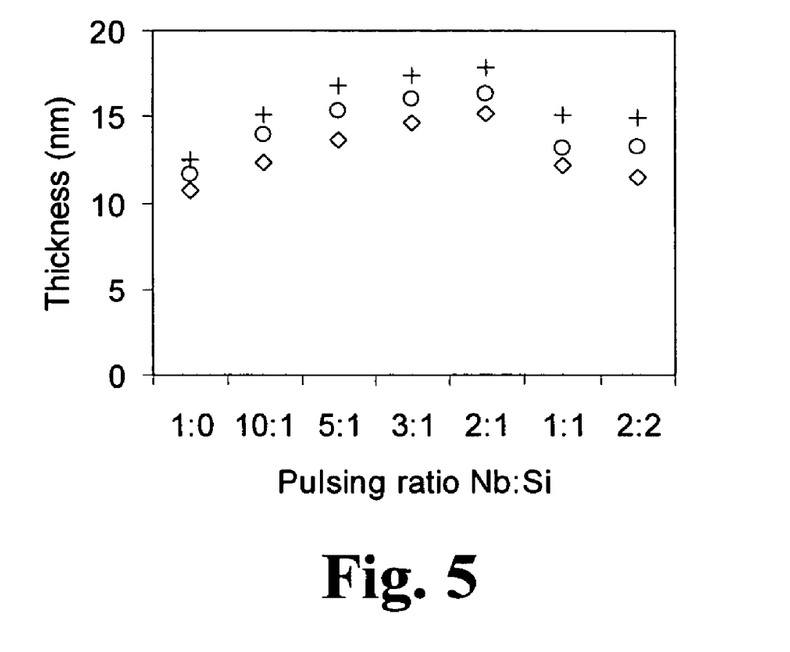
FIG. 5 shows average (○), maximum (+) and minimum (◇) thicknesses measured from 49 points for 200 mm NbN and Nb(Si)N films (500 cycles/200 mm wafers) as a function of pulsing ratios.

The growth rate of Nb(Si)N on 200 mm wafers with a pulsing ratio of Nb:Si of 5:1 (i.e., silicon is introduced in every fifth cycle) was 0.34 Å/cycle at 400° C. Bonds between silicon and nitrogen were assumed to result from the reaction cycles of SiCl$_4$ and NH$_3$, and thus based on the higher growth rate of Nb(Si)N than that of pure NbN, the theoretical growth rate of Si$_3$N$_4$ within the NbN process was estimated to be 0.8 Å/cycle. It is interestingly high, since pure Si$_3$N$_4$ did not grow from SiCl$_4$ and NH$_3$ at 400° C. The estimated high growth rate is likely due to the higher reactivity of SiCl$_4$ towards the Nb-containing surface species than the Si-containing surface species. The difference in the chemisorption of SiCl$_4$ on these surface species was also seen as a variation in the film thicknesses when depositing Nb(Si)N films with different pulsing ratios. From FIG. 5 it can be seen that if the number of SiCl$_4$ and NH$_3$ pulses is increased the growth starts to slow down.

Figure 6:
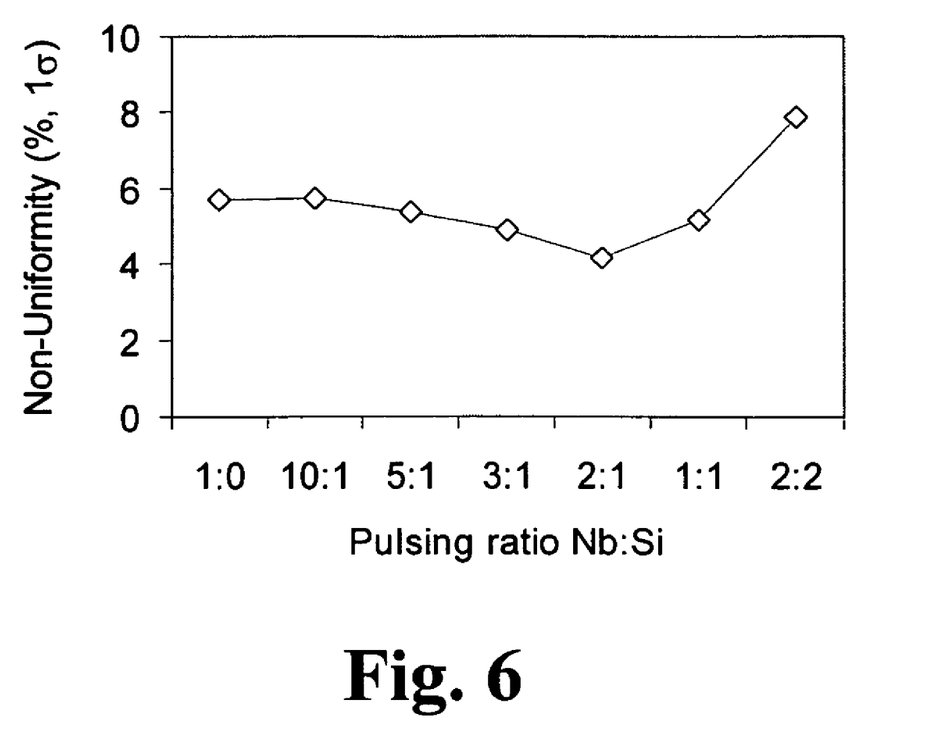
FIG. 6 shows thickness uniformities (1σ) measured from 49 points for NbN and Nb(Si)N films (500 cycles/200 mm wafers) as a function of pulsing ratios.

The pulsing ratio had also an effect on the uniformity (see FIG. 6). Interestingly the non-uniformity first decreased with increasing number of SiCl$_4$ and NH$_3$ cycles up to the ratio of 2:1, after which point the non-uniformity started increasing. Surface species of Si—Cl can either be bonded as Nb—N—Si—Cl or Si—N—SiCl, and it might be that the ease of Cl removal from Si—Cl is different in each case, which affects the film uniformity when similar pulse times for NH$_3$ are used. Thus, the formation of Si—N—Si—Cl-species is preferably avoided to obtain good quality films in terms of Si doping and thickness uniformity. Formation of Si—N—Si—Cl-species can be avoided by choosing the right pulsing ratios. This can readily be accomplished through routine experimentation.

EXAMPLE 3

A hafnium oxide gate dielectric layer is deposited by ALD on a very thin layer of silicon oxide, which has itself been deposited or formed on a substrate by any appropriate method. The silicon oxide on the semiconductor substrate ensures that the initiation of the growth of hafnium oxide by ALD is favorable (i.e. there are enough active surface sites, such as —OH$_x$-groups, on the surface of the substrate). A desired thickness of hafnium oxide is deposited by ALD using HfCl$_4$ and H$_2$O as precursors at a deposition temperature of about 300° C. Nitrogen is used as a carrier gas and a purging gas. Preferably HfCl$_4$ is introduced to the reaction chamber as the first precursor in the first deposition cycle. Preferably H$_2$O is introduced as the last precursor of the last deposition cycle, in order to provide more active surface sites on the surface of the deposited HfO$_2$.

A niobium silicon nitride film is deposited over the HfO$_2$ film. The niobium silicon nitride film is preferably deposited in the same cluster tool (i.e. without air break). Niobium silicon nitride Nb(Si)N is deposited by ALD using NbCl$_5$, SiCl$_4$ and NH$_3$ as precursors at 350° C. or above. The deposition cycles are repeated until the desired thickness is achieved. Preferably the NH$_3$ is introduced as the first precursor of the first deposition cycle to the reaction chamber, in order to eliminate the residual chlorine ligands present on the hafnium oxide surface. NH$_3$ is preferably the last precursor to be introduced to the reaction chamber in the last cycle, in order to provide —NH$_x$ group terminated niobium nitride surface instead of a chlorine terminated surface. On the Nb(Si)N layer, a thin layer of metal is deposited, for example tungsten, which acts as a conductor.

The performance of the gate stack/device as manufactured according to the above description is measured. The work function of the gate electrode is measured to be approximately 4.1-4.3 eV, confirming that a Nb(Si)N film deposited by this method is can be used for NMOS type metal gates in MOSFET transistors.

EXAMPLE 4

Tantalum boron nitride Ta(B)N films can be deposited on a gate dielectric layer in an NMOS transistor by using $TaCl_5$, $BCl_3$ and $NH_3$ as precursors in an ALD process as described above. A pulsing sequence with a ratio of approximately 1:1 Ta:B is preferably used for doping in deposition cycles. That is, the boron reactant is preferably included in each deposition cycle.

The performance of the gate stack/device as manufactured according to the above description is measured. The work function of the gate electrode is measured to be approximately 4.1-4.3 eV and therefore a Ta(B)N film deposited according to the disclosed methods can be used for NMOS type metal gates in MOSFET transistors.

EXAMPLE 5

Molybdenum nitride MoN and molybdenum silicon nitride Mo(Si)N films are deposited on a substrate using $MoCl_5$, $SiCl_4$ (not in MoN) and $NH_3$ as precursors in an ALD process as described above. A pulsing sequence with a precursor ratio of approximately 3:1 Mo:Si is used to provide for silicon doping in the deposition process. That is, the silicon dopant is preferably introduced in every third cycle.

Barrier performance and thermal stability of the deposited films is measured and Mo(Si)N is found to be a better barrier and more thermally stable than undoped MoN.

EXAMPLE 6

A niobium silicon nitride Nb(Si)N film is deposited on a gate dielectric layer in an NMOS transistor by using $NbCl_5$, $SiCl_4$ and nitrogen and hydrogen plasma as precursors in an ALD process as described above. A pulsing sequence comprising a precursor ratio of approximately 2:1 Nb:Si is used to provide for doping in the deposition process. That is, the silicon precursor is provided in every other deposition cycle.

The performance of the gate stack/device as manufactured according to the above description will be measured. The work function of the gate electrode will be also measured to be approximately 4.1-4.3 eV and therefore the deposited Nb(Si)N film will be applicable for use in NMOS type metal gates in MOSFET transistors.

EXAMPLE 7

A niobium silicon nitride Nb(Si)N film is deposited on a capacitor structure as an electrode by using $NbCl_5$, $SiCl_4$ and $NH_3$ as precursors in an ALD process, essentially as described above. A pulsing sequence comprising a precursor ratio of approximately 5:1 Nb:Si is used to provide for silicon doping in deposition process. That is, the silicon precursor is provided in every fifth deposition cycle. Nb(Si)N electrodes will have improved performance and quality compared to NbN electrodes.

It will be appreciated by those skilled in the art that various other omissions, additions and modifications may be made to the methods and structures described above without departing from the scope of the invention. All such modifications and changes are intended to fall within the scope of the invention, as defined by the appended claims.

We claim:

1. A process for producing a boron or silicon doped metal nitride thin film on a substrate in a reaction chamber by atomic layer deposition, the process comprising at least one ALD cycle in which the following steps are performed in order:
   providing a first vapor phase reactant pulse comprising a metal precursor into the reaction chamber to form no more than about a single molecular layer of the metal precursor on the substrate;
   removing excess first reactant from the reaction chamber;
   providing a second vapor phase reactant pulse comprising a nitrogen precursor to the reaction chamber such that the nitrogen precursor reacts with the metal precursor on the substrate;
   removing excess second reactant and any reaction by-products from the reaction chamber;
   providing a third vapor phase reactant pulse comprising a silicon or boron precursor to the reaction chamber;
   removing excess third reactant and any reaction by-products from the reaction chamber;
   providing a fourth vapor phase reactant pulse comprising a nitrogen precursor to the reaction chamber; and
   removing excess fourth reactant and any reaction by-products from the reaction chamber.

2. The process according to claim 1, wherein the second vapor phase reactant and fourth vapor phase reactant comprise $NH_3$.

3. The process according to claim 1, wherein the second vapor phase reactant and fourth vapor phase reactant both comprise nitrogen and hydrogen containing plasma.

4. The process according to claim 1, wherein the fourth vapor phase reactant is hydrogen containing plasma.

5. The process according to claim 1, comprising using as a precursor of silicon or boron a compound according to formula I $$R^1_p A X_q \qquad \text{I}$$

wherein A stands for silicon or boron;
R$^1$ stands for an organic ligand bonded to A by a carbon-A bond;
X stands for a halogen;
q is an integer having a value in the range from 1 to the valence of A; and
p is an integer having a value in the range from 0 to q−1.

6. The process according to claim 5, comprising using a compound of formula I, wherein q has a value in the range from 2 to the valence of A, and X is selected from the group of chloro, bromo, iodo and fluoro.

7. The process according to claim 5, comprising using a compound of formula I, wherein p is greater than zero, and wherein R$^1$ is selected from the group of:
   linear or branched $C_1$-$C_{20}$ alkyl or alkenyl groups;
   halogenated alkyl or alkenyl groups, wherein at least one hydrogen atom is replaced with a fluorine, chlorine, bromine or iodine atom;
   carbocyclic groups; and
   heterocyclic groups.

8. The process according to claim 5, comprising using a compound selected from the group of $SiCl_4$ and $BCl_3$ as the precursor of silicon or boron.

9. The process according to claim 5, wherein the fourth vapor phase reactant pulse is introduced into the reactor over a time interval which is 2 to 20 times longer than the time interval for the introduction of the second vapor phase reactant pulse.

10. The process according to claim 1, wherein the metal precursor is selected from precursors of niobium, tantalum, titanium, tungsten and molybdenum and mixtures thereof.

11. The process according to claim 10, wherein the metal precursor is a chloride compound of the metal.

12. The process according to claim 1, wherein the substrate is maintained at a temperature of 300-500° C.

13. A method of fabricating a semiconductor device, comprising
depositing a gate dielectric layer over a semiconductor substrate;
forming a gate electrode comprising a lower part and an upper part over the gate dielectric layer, the gate dielectric layer and the gate electrode forming a gate stack; and
tuning the overall electronegativity of the lower part of the gate electrode to provide a desired work function of the gate stack,
wherein at least the lower part of the gate electrode is formed by an atomic layer deposition (ALD) type process comprising one or more deposition cycles, each cycle comprising a sequence of alternating and repeated exposure of the substrate to two or more different reactants to form an elemental metal film or a compound film of at least binary composition, and wherein the work function of the lower part of the electrode is tuned by adjusting the deposition cycles by introducing at least one pulse of a precursor of silicon or boron or a combination thereof in selected deposition cycles, wherein the precursor of silicon or boron is a compound having the formula I $$R^1_p AX_q \qquad \text{I}$$

wherein A stands for silicon or boron;
R$^1$ stands for an organic ligand bonded to A by a carbon-A bond;
X stands for halogen;
q is an integer having a value in the range from 1 to the valence of A; and
p is an integer having a value in the range from 0 to q−1.

14. The process according to claim 13, comprising using a compound selected from the group of SiCl$_4$ and BCl$_3$ as the precursor of silicon or boron.

15. A process for producing metal nitride thin films having enhanced barrier properties, comprising doping the metal nitride thin films with silicon or boron or a combination thereof by an atomic layer deposition (ALD) type process using as a precursor of silicon or boron a compound having the formula I $$R^1_p AX_q \qquad \text{I}$$

wherein A stands for silicon or boron;
R$^1$ stands for an organic ligand bonded to A by a carbon-A bond;
X stands for halogen;
q is an integer having a value in the range from 1 to the valence of A; and
p is an integer having a value in the range from 0 to q−1,
wherein the atomic layer deposition process comprises multiple metal deposition cycles and multiple dopant deposition cycles,
wherein a metal deposition cycle comprises:
providing a vapor phase reactant pulse comprising a metal precursor into the reaction chamber to form no more than about a single molecular layer of the metal precursor on the substrate; and
providing a vapor phase reactant pulse comprising a nitrogen precursor to the reaction chamber such that the nitrogen reacts with the metal precursor on the substrate;
wherein a dopant deposition cycle comprises:
providing a vapor phase reactant pulse comprising a silicon or boron precursor of the formula (I) into the reaction chamber to form no more than about a single molecular layer of the silicon or boron precursor on the substrate; and
providing a vapor phase reactant pulse comprising a nitrogen precursor to the reaction chamber such that the nitrogen reacts with the silicon or boron precursor on the substrate;
wherein at least one dopant deposition cycle immediately follows a metal deposition cycle, and
wherein the metal deposition cycle and dopant deposition cycle are repeated until a thin film of the desired composition and thickness is formed.

16. The process according to claim 15, comprising using a compound selected from the group of SiCl$_4$ and BCl$_3$ as the precursor of silicon or boron.

17. An atomic layer deposition type process for producing doped metal nitride thin films for electrodes in capacitor structures, comprising doping the metal nitride thin films using precursors of silicon or boron or a combination thereof, said precursors having the formula I $$R^1_p AX_q \qquad \text{I}$$

wherein A stands for silicon or boron;
R$^1$ stands for an organic ligand bonded to A by a carbon-A bond;
X stands for halogen;
q is an integer having a value in the range from 1 to the valence of A; and
p is an integer having a value in the range from 0 to q−1
wherein the atomic layer deposition process comprises multiple metal deposition cycles and multiple dopant deposition cycles,
wherein a metal deposition cycle comprises: alternately and sequentially providing a vapor phase reactant pulse comprising a metal precursor and a vapor phase reactant pulse comprising a nitrogen precursor to the reaction chamber;
wherein a dopant deposition cycle comprises: alternately and sequentially providing a vapor phase reactant pulse comprising a silicon or boron precursor of the formula (I) and a vapor phase reactant pulse comprising a nitrogen precursor to the reaction chamber;
wherein at least one dopant deposition cycle immediately follows a metal deposition cycle, and
wherein the metal deposition cycle and dopant deposition cycle are repeated until a thin film of the desired composition is formed.

18. The method of claim 15, wherein the vapor phase reactant pulse comprising nitrogen in the dopant deposition cycle is introduced into the reactor over a time interval which is 2 to 20 times longer than the time interval for the vapor phase reactant pulse comprising nitrogen in the metal deposition cycle.

19. The process according to claim 17, comprising using a compound selected from the group of SiCl$_4$ and BCl$_3$ as a precursor of silicon or boron.

20. The method of claim 17, wherein the metal precursor comprises niobium, tantalum, titanium, tungsten and molybdenum.

* * * * *